United States Patent [19]

Araki

[11] 4,204,166
[45] May 20, 1980

[54] VERY HIGH FREQUENCY TUNER

[75] Inventor: Itiro Araki, Shijonawate, Japan

[73] Assignee: Sanyo Electric Co., Ltd., Osaka, Japan

[21] Appl. No.: 20,846

[22] Filed: Mar. 15, 1979

[30] Foreign Application Priority Data

Mar. 15, 1978 [JP] Japan .................................. 53-30697

[51] Int. Cl.$^2$ .............................................. H04B 1/18
[52] U.S. Cl. ....................................... 455/289; 334/15; 455/340
[58] Field of Search .................. 334/15; 325/376, 377, 325/383, 385, 387, 488, 489, 490, 427

[56] References Cited

U.S. PATENT DOCUMENTS

| | | | |
|---|---|---|---|
| 3,579,113 | 5/1971 | Jabbar | 325/376 |
| 3,582,791 | 6/1971 | Slavin | 325/387 |
| 3,587,017 | 6/1971 | Kurusu | 325/387 |
| 3,613,008 | 10/1971 | Jabbar | 325/387 |
| 3,940,714 | 2/1976 | Sato | 334/15 |
| 4,023,106 | 5/1977 | Utsunomiya | 334/15 |

*Primary Examiner*—Alfred E. Smith
*Assistant Examiner*—Robert E. Wise
*Attorney, Agent, or Firm*—Armstrong, Nikaido, Marmelstein & Kubovcik

[57] ABSTRACT

A very high frequency tuner for selection of a broadcasting signal through variation of a capacitance value formed across a voltage controlled variable capacitance diode responsive to a tuning control voltage comprises an improved interstage tuned coupling circuit between a high frequency amplifier and a frequency converter of the very high frequency tuner for transmission of the output signal. The interstage tuned coupling circuit comprises a first inductance coil coupled in series between the output of the high frequency amplifier and the input of the frequency converter, a voltage controlled variable capacitance diode coupled to the input of the first inductance coil in shunt fashion so as to be responsive to a tuning control voltage, whereby a capacitance value formed thereacross is variable as a function of the tuning control voltage, a second inductance coil having a large inductance value and coupled to the output of the first inductance coil in a shunt fashion, a second capacitor coupled to the output of the first inductance coil in a shunt fashion, a switching means responsive to a band switching control signal for achieving a parallel tuning circuit including the voltage controlled variable capacitance diode and the first and second inductance coils in the low frequency band mode and for achieving a $\pi$-type tuning circuit including the voltage controlled variable capacitance diode, the first inductance coil and the second capacitor in the high frequency band mode, and a coupling means for coupling the output of the tuning circuit to the frequency converter.

4 Claims, 10 Drawing Figures

VERY HIGH FREQUENCY TUNER

BACKGROUND OF THE INVENTION

1. Field of the Invention

The present invention relates to a very high frequency tuner, and more specifically relates to an improvement in a tuned coupling circuit between a high frequency amplifier and a frequency converter in a very high frequency tuner, particularly for use in television receivers.

2. Description of the Prior Art

A typical prior art very high frequency tuner comprises a high frequency amplifier and a frequency converter, with a tuned coupling means interposed therebetween. FIG. 1 is a block diagram of a typical very high frequency tuner, in which the present invention can be advantageously employed. The tuner is shown connected to an antenna ANT for receiving a broadcasting wave and comprises a high frequency amplifying means HFA for selectively amplifying the selected high frequency signal, a local oscillator means 5 for providing an oscillation frequency signal the frequency of which is different by a given frequency difference from the selected high frequency signal, and a mixing means 4 responsive to the received high frequency signal and the local oscillation frequency signal for providing an intermediate frequency signal. The high frequency amplifying means HFA comprises a high frequency tuning circuit 1, a high frequency amplifying transistor circuit 2 and an interstage tuned coupling circuit 3. A detailed structure and operation of the high frequency tuned circuit 1, the high frequency amplifying transistor circuit 2, the mixer 4 and the oscillator 5 are well known to those skilled in the art. Hence, it is not believed necessary to describe the same in more detail for the purpose of describing the present invention. The mixer means 4 and the local oscillating means 5 are generally referred to as a frequency converter.

The present invention is directed to an improvement in the interstage tuned coupling circuit 3. As well known, one type of such an interstage tuned coupling circuit comprises a double tuned coupling circuit, i.e. a pair of inductively coupled tuned circuits and the other type of such a tuned coupling circuit comprises a single tuned coupling circuit. In comparison of these, a single tuned circuit is more advantageous from the standpoint of economy and fabrication of the same.

FIG. 2 shows a schematic diagram of a typical prior art single tuned coupling circuit employed as an interstage tuned coupling circuit between a high frequency amplifier and a frequency converter. Referring to FIG. 2, the output of the high frequency amplifier 2 implemented by a transistor TR1 and the input of the mixer 4 implemented by a transistor TR2 are coupled by means of a series connection of capacitors C1 and C4. The junction of the capacitors C1 and C4 is connected through a series connection of a capacitor C2 and a voltage controlled variable capacitance diode D1 to the ground, the polarity of the diode D1 being selected such that the cathode is connected to the capacitor C2 and the anode is connected to the ground. The junction of the capacitor C2 and the diode D1 is connected to receive a tuning control voltage through a resistor R1. The junction of the capacitors C1 and C4 is also connected through a series connection of a first and second inductance coils L1 and L2 to the ground. The junction of the inductance coils L1 and L2 is connected through a switching diode D2 and further through a resistor R2 to a source of a band selection switching control signal. The junction of the diode D2 and the resistor R2 is connected through a capacitor C3 to the ground for the purpose of decoupling.

In operation, when a low frequency band of the television channels is to be selected, a frequency band selection control signal of a higher voltage is applied through the resistor R2 to the diode D2, so that the switching diode D2 is reverse biassed and hence is turned off, with the result that a parallel tuning circuit is constituted by the capacitance across the voltage controlled variable capacitance diode D1 and the inductance coils L1 and L2, as series connected, and when a high frequency band of the television channels is to be selected a frequency band selection control signal of a lower voltage is applied through the resistor R2 to the diode D2, so that the switching diode D2 is forward biassed and is turned on, with the result that the inductance coil L2 is short circuitted and a parallel tuning circuit is constituted by a capacitance across the voltage controlled variable capacitance diode D1 and the inductance coil L1.

The FIG. 2 very high frequency tuner, however, suffered from a disadvantage that a capability of eliminating an image interference is poor on the occasion of high band reception. An image inteference may be defined as an adverse influence caused by a pseudo intermediate frequency signal resulting from a high frequency signal of a channel the frequency of which is higher than that of a channel being received. By way of an example, assuming that a broadcasting channel of the central frequency f1 is to be received, then the local oscillator 5 is adapted such that the local oscillation frequency f0 satisfies the relation f0−f1=fi with respect to the central frequency f1 of the broadcasting channel where fi is the intermediate frequency and is 56.5 MHz and as a result an intermediate frequency signal based on the desired broadcasting channel is obtained and applied to the succeeding intermediate frequency circuit; however, if and when a high frequency signal of a broadcasting channel the central frequency f2 of which satisfies the relation f2−f0=56.5 MHz is transmitted from the high frequency amplifying transistor TR1 to the frequency converting transistor TR2, an intermediate frequency is produced based on the above described broadcasting channel of the higher frequency f2, which causes a noise on the screen of the television receiver. Accordingly, a consideration is required to prevent such higher frequency channel signal from being transferred to the frequency converting transistor TR2. It is also required to prevent an interference by virtue of any lower frequency signal such as an intermediate frequency signal as well as an interference by virtue of the signal of a frequency higher than a frequency being received.

SUMMARY OF THE INVENTION

Briefly described, the present invention comprises an improved interstage tuned coupling circuit between a high frequency amplifier and a frequency converter in a very high frequency tuner for selection of a broadcasting signal, which comprises a first inductance coil coupled in series between the output of the high frequency amplifier in the input of the frequency converter, a voltage controlled variable reactance device coupled to the input of the first inductance coil in a shunt fashion so as to be responsive to a tuning control voltage, whereby a reactance value formed thereacross is variable as a function of the tuning control voltage, a second inductance coil having a large inductance value and coupled to the output of the first inductance coil in a shunt fashion, a second capacitor coupled to the output of the first inductance coil in a shunt fashion, a switching means responsive to a band switching control signal for achieving a parallel tuning circuit including the voltage controlled variable reactance device and the first and second inductance coils in the low frequency band mode and for achieving a π-type tuning circuit including the voltage controlled variable reactance device, the first inductance coil and the second capacitor in the high frequency band mode, and a coupling means for coupling the output of the tuning circuit to the frequency converter.

Preferably, the switching means comprises a switching device coupled between the second inductance coil and the second capacitor and the coupling means comprises a third capacitor coupled between the junction of the switching device and the first inductance coil and the input of the frequency converter and a fourth capacitor coupled between the junction of the switching device and the second capacitor and the input of the frequency converter, whereby only the third capacitor is rendered effective in the low frequency band mode and both the third and fourth capacitors are rendered effective in the high frequency band mode.

Therefore, a principal object of the present invention is to provide an improved interstage tuned coupling circuit between a high frequency amplifier and a frequency converter in a very high frequency tuner for selection of a broadcasting signal through variation of a reactance value formed across a voltage controlled variable reactance device responsive to a tuning control voltage.

Another object of the present invention is to provide an improved interstage tuned coupling circuit between a high frequency amplifier and a frequency converter in a very high frequency tuner, wherein an image interference occurring in the high frequency band mode is eliminated while removal of an intermediate frequency interference occurring in the lower frequency band mode is considered.

A further object of the present invention is to provide an improved interstage tuned coupling circuit between a high frequency amplifier and a frequency converter in a very high frequency tuner, wherein a π-type tuning circuit is selectively constituted in the high frequency band mode and a parallel tuning circuit is constituted in the low frequency band mode.

Still a further object of the present invention is to provide an improved interstage tuned coupling circuit between a high frequency amplifier and a frequency converter in a very high frequency tuner, wherein transmission of a signal of an undesired other channel is prevented in the high frequency band mode, whereby a pseudo intermediate frequency signal is suppressed from being reduced in the frequency converter.

Still another object of the present invention is to provide an improved interstage tuned coupling circuit between a high frequency amplifier and a frequency converter in a very high frequency tuner, wherein an intermediate frequency interference is suppressed in the low frequency band mode.

These and other objects, features, aspects and advantages of the present invention will become more apparent from the following detailed description of the preferred embodiments of the present invention made in conjunction with the accompanying drawings.

BRIEF DESCRIPTION OF THE DRAWINGS

FIGS. 7, 7A, 7B, and 7C are a schematic diagram of one example employing the FIG. 3 embodiment, with minor changes.

DESCRIPTION OF THE PREFERRED EMBODIMENTS

Figure 1:
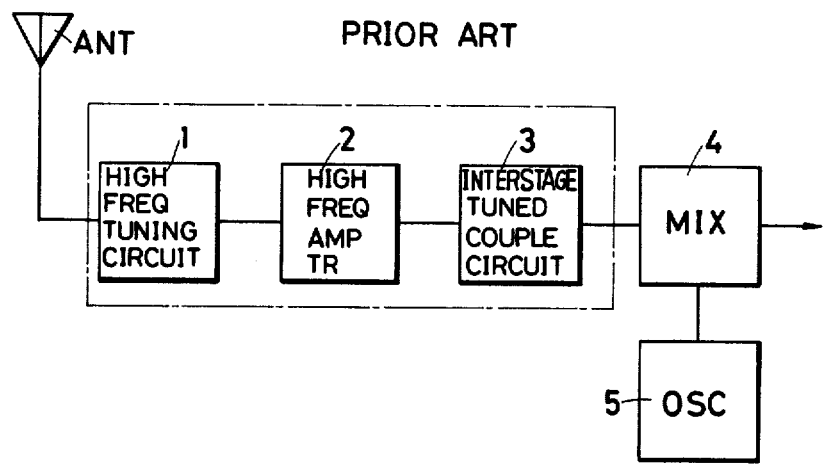
FIG. 1 is a block diagram of a typical very high frequency tuner, in which the present invention can be advantageously employed.
Figure 2:
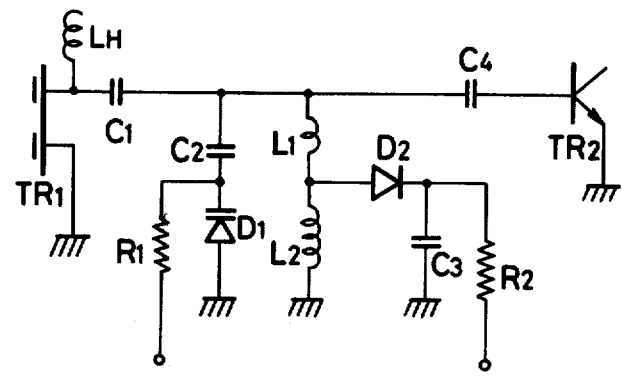
FIG. 2 shows a schematic diagram of a typical prior art single tuned coupling circuit employed as an interstage tuned coupling circuit between a high frequency amplifier and a frequency converter in a very high frequency tuner.
Figure 3:
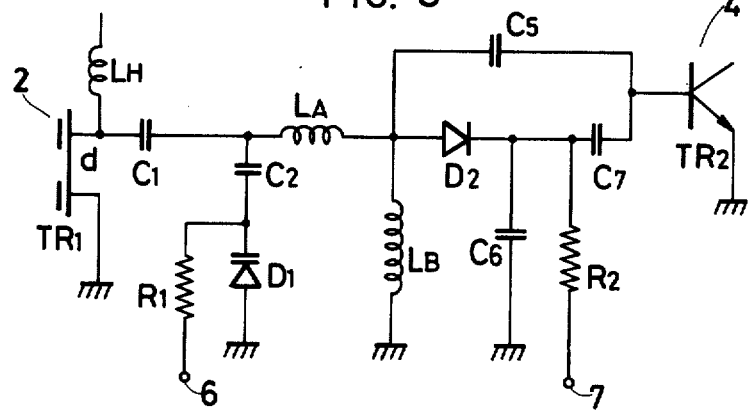
FIG. 3 shows a schematic diagram of one embodiment of the inventive interstage tuned coupling circuit between a high frequency amplifier and a frequency converter in a very high frequency tuner.

FIG. 3 shows a schematic diagram of one embodiment of the inventive interstage tuned coupling circuit between a high frequency amplifier and a frequency converter in a very high frequency tuner. Referring to FIG. 3, the drain electrode d of a field effect transistor TR1 implementing the high frequency amplifier 2 is connected through a capacitor C1 to the input end of a first inductance coil LA disposed in series. The junction of the capacitor C1 and the first inductance coil LA is connected through a series connection of a capacitor C2 and a voltage controlled variable capacitance diode D1 to the ground, the polarity of the diode D1 being selected such that the cathode is connected to the capacitor and the anode is connected to the ground. The junction of the capacitor C2 and the diode D1 is connected to receive a tuning control voltage through a resistor R1 from a terminal 6. Such a voltage controlled variable capacitor uses a capacitance formed at a barrier portion of a diode, which is variable as a function of a reverse voltage applied thereacross and is known as a variable capacitance diode. The terminal 6 is connected to a voltage supply capable of providing a voltage variable as chosen in response to manual operation, which causes a capacitance with which the tuning apparatus selects desired tuning frequency and thus selects a desired transmitting station. The output of the first inductance coil LA is connected to the ground through a second inductance coil LB having a sufficiently large inductance value as compared with that of the first inductance coil LA. The junction of the first and second inductance coils LA and LB is connected through a third capacitor C5 to the base electrode of a transistor TR2 implementing a frequency converter 4. The junction of the first and second inductance coils LA and LB is further connected through a series connection of a switching diode D2 and a fourth capacitor C7 to the base electrode of the transistor TR2. The junction of the diode D2 and the capacitor C7 is connected through a second capacitor C6 to the ground. The junction of the diode D2 and the capacitor C7 is further connected through a resistor R2 to a band selection switching control signal generator, not shown, at a terminal 7. The capacitance values of the capacitors C1 and C2 may be 20 pF, the capacitance value of the capacitor C5 may be 3 to 5 pF, the capacitance value of the capacitor C6 may be 20 pF, and the capacitance value of the capacitor C7 may be 3 to 8 pF.

The above described tuning voltage source and the band selection control signal source are well known to those skilled in the art. An example of such tuning voltage source and band selection switching control signal source are disclosed in U.S. Pat. No. 4,031,475 issued June 21, 1977 to the same assignee as the present invention and the same is incorporated herein by reference to the same.

Figure 4:
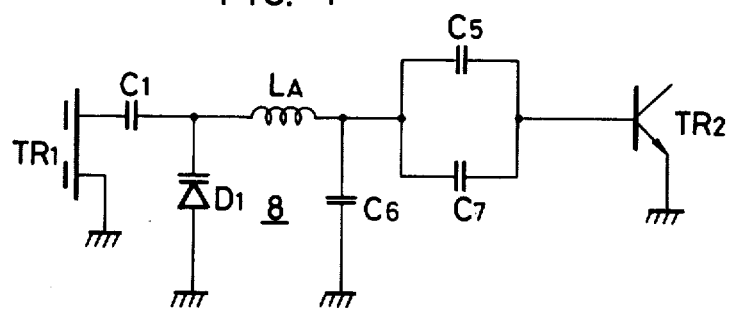
FIG. 4 shows an equivalent circuit of the FIG. 3 diagram when the very high frequency tuner is placed in the high frequency band mode.

In operation, the band selection switching control signal generator, not shown, connected to the terminal 7 is responsive to selection of a channel in the high frequency band to provide a band selection switching signal of a negative direct current voltage representing selection of a channel in the high frequency band and as a result the switching diode D2 is rendered conductive. FIG. 4 shows an equivalent circuit of the FIG. 3 diagram in such high frequency band mode wherein the switching diode D2 is rendered conductive. Referring to FIG. 4, the switching diode D2 is shown as short circuitted and the second inductance coil LB is shown as omitted, because the second inductance coil LB has a relatively large inductance value and therefore a reactance value of the second capacitor C6 is smaller as compared with the reactance value of the second inductance coil LB2 in the high frequency band mode. Hence, in the high frequency band mode a $\pi$-type tuned coupling circuit 8 is constituted between the first capacitor C1 and the third and fourth capacitors C5 and C7, which are coupled in parallel in the high frequency band mode to constitute a coupling circuit between the tuned coupling circuit 8 and the frequency converter 4.

Figure 5:
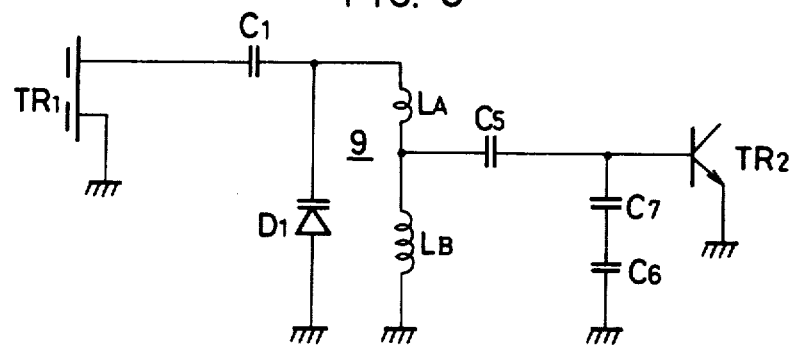
FIG. 5 is an equivalent circuit of the FIG. 3 diagram when the very high frequency tuner is placed in the lower frequency band mode.

On the other hand, the band selection switching control signal generator, not shown, connected to the terminal 7 is responsive to selection of a channel in the low frequency band to provide a band selection switching control signal of a positive voltage representing selection of a channel in the low frequency band and as a result the switching diode D2 is rendered non-conductive. FIG. 5 shows an equivalent circuit of the FIG. 3 diagram in such low frequency band mode. Referring to FIG. 5, the switching diode D2 is shown as open circuitted. Thus, it would be appreciated that in the low frequency band mode a parallel tuning circuit 9 including a capacitance across the voltage controlled variable capacitance diode D1 and an inductance component of the first and second inductance coils LA and LB is constituted between the first capacitor C1 and the third capacitor C5, wherein the inductance value of the first inductance coil LA is negligible as compared with the inductance value of the second inductance coil LB in this situation because LA << LB. It would be further appreciated that since the switching diode D2 is open circuitted, it follows that a series connection of the second and fourth capacitors C6 and C7 is connected between the base electrode of the frequency converter transistor TR2 and the ground. The reason why the fourth capacitor C7 is provided will be described in the following. As described previously, in the high frequency band mode, the $\pi$-type tuned coupling circuit 8 is constituted by the voltage controlled variable capacitance diode D1, the first inductance coil LA and the second capacitor C6, wherein a capacitance across the voltage controlled variable capacitance diode D1 and a capacitance of the second capacitor C6 is connected in series and in such situation the larger the capacitance value of the second capacitor C6 the larger a variable range of the composite capacitance as a result of variation of the capacitance of the voltage controlled variable capacitance diode D1. Since the second capacitor C6 is selected to be of a relatively large capacitance value for the above described reason, the fourth capacitor C7 is coupled to the third capacitor C5 to increase a coupling capacitance value. Originally, the third capacitor C5 is aimed to achieve a coupling in the low frequency band mode and hence the capacitance value thereof is selected to be a relatively small value, say 3 to 5 pF. The reason is that referring to FIG. 5 an increased capacitance value of the capacitor C5 makes it difficult to provide for a larger frequency variation range by the parallel tuned circuit 9 and is liable to cause a tracking error. In other words, since in the low frequency band mode a parallel tuned circuit 9 is constituted wherein the capacitors C5, C6 and C7 are coupled in parallel with the capacitance across the voltage controlled variable capacitance diode D1, the capacitance value of the capacitor C5 is preferably small.

Figure 6:
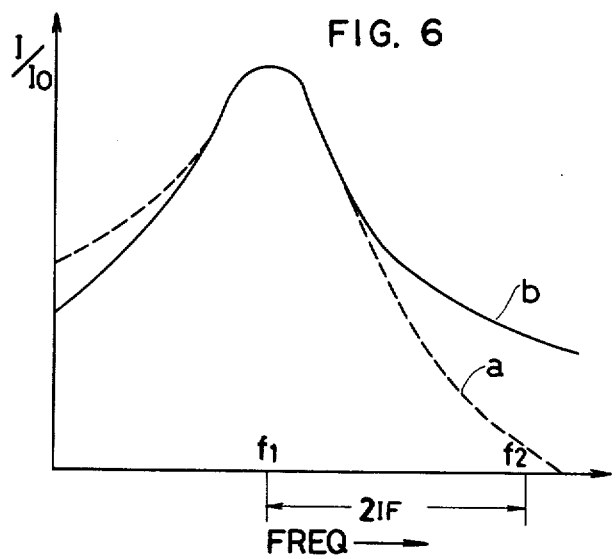
FIG. 6 is a graph showing the selectivity characteristic of the inventive very high frequency tuner, wherein the abscissa indicates the frequency and the ordinate indicates a ratio of a current to a tuning current.

According to an aspect of the present invention, the interstage tuned coupling circuit between the high frequency amplifier and the frequency converter is switched to form a $\pi$-type tuning circuit in the high frequency band reception and to form a parallel tuning circuit in the low frequency band reception. It is pointed out that this switching of the interstage tuned coupling circuit between a $\pi$-type tuning circuit and a parallel tuning circuit brings about the following advantages. More specifically, in the high frequency band reception the impedance by the first inductance coil LA interposed in series becomes very dominant with respect to the other channel signal the frequency of which is higher than that of the channel being received, whereby such undesired other channel signal is prevented from being transmitted from the high frequency amplifier to the frequency converter and the frequency converter 4 is suppressed from giving rise to a pseudo intermediate frequency signal. Referring to FIG. 6, which shows a graph showing the selectivity characteristic of the inventive very high frequency tuner, wherein the abscissa indicates the frequency and the ordinate indicates a ratio of a current to a tuning current, the curve (a) shows the above described advantageous feature of the present invention, due to the fact that the higher channel signal of the frequency f2 spaced apart by two times the intermediate frequency from the central frequency f1 of the channel being received is substantially rejected. In addition, in view of the fact that the output impedance of the high frequency amplifier 2 implemented by the transistor TR1 is relatively large while the input impedance of the frequency converter 4 implemented by the transistor TR2 is relatively low, a $\pi$-type tuning circuit is extremely preferred from the standpoint of the impedance matching as an interstage tuned circuit being interposed between the high frequency amplifier and the frequency converter in the high frequency band mode.

On the other hand, in the low frequency band mode, the interstage tuned coupling circuit is switched to form a parallel tuning circuit rather than a $\pi$-type tuning circuit and the selectivity characteristic is shown by the curve (b) in FIG. 6, which shows that the parallel tuning circuit 9 provides for an increased attenuation in the lower frequency region and thus prevents an intermediate frequency signal interference. More specifically, since the intermediate frequency is closer to the frequency of a lower frequency channel in a lower frequency band, for example in West Germany the radio frequency of the channel 2 is 51 MHz, whereas the intermediate frequency is approximately 36 MHz, it is necessary to prevent the intermediate frequency signal interference on the occasion of reception of a lower frequency channel in a lower frequency band, but with reference to FIG. 6, according to the present invention the parallel tuning circuit having the selectivity characteristic shown by the curve (b) is more preferred in the low frequency band mode as compared with the selectivity characteristic by the $\pi$-type tuning circuit by the curve (a). As seen from FIG. 6, in the low frequency band reception mode the attenuation in the higher frequency region by the parallel tuning circuit is slightly less; however, since the ratio of the frequency being received and the image frequency i.e. the higher channel frequency is large in the lower frequency band, the image interference is of little problem and causes no inconvenience. It is observed that the capacitors C6 and C7 are interposed between the base electrode of the transistor TR2 constituting the frequency converter and the reference potential or ground in the low frequency band reception; however, since the capacitance values of the capacitors C6 and C7 are sufficiently small compared with the input capacitance of 20 to 30 pF, no inconvenience is caused.

Figure 7A:
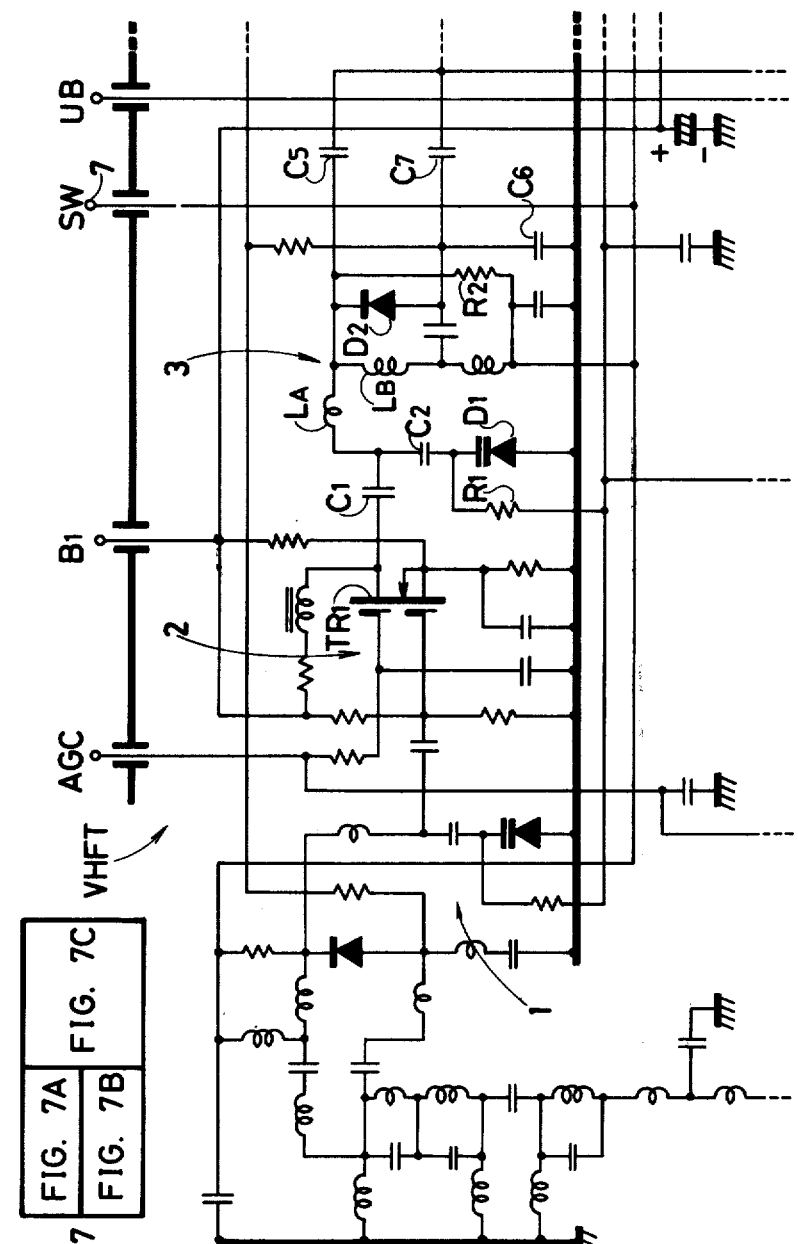
Figure 7B:
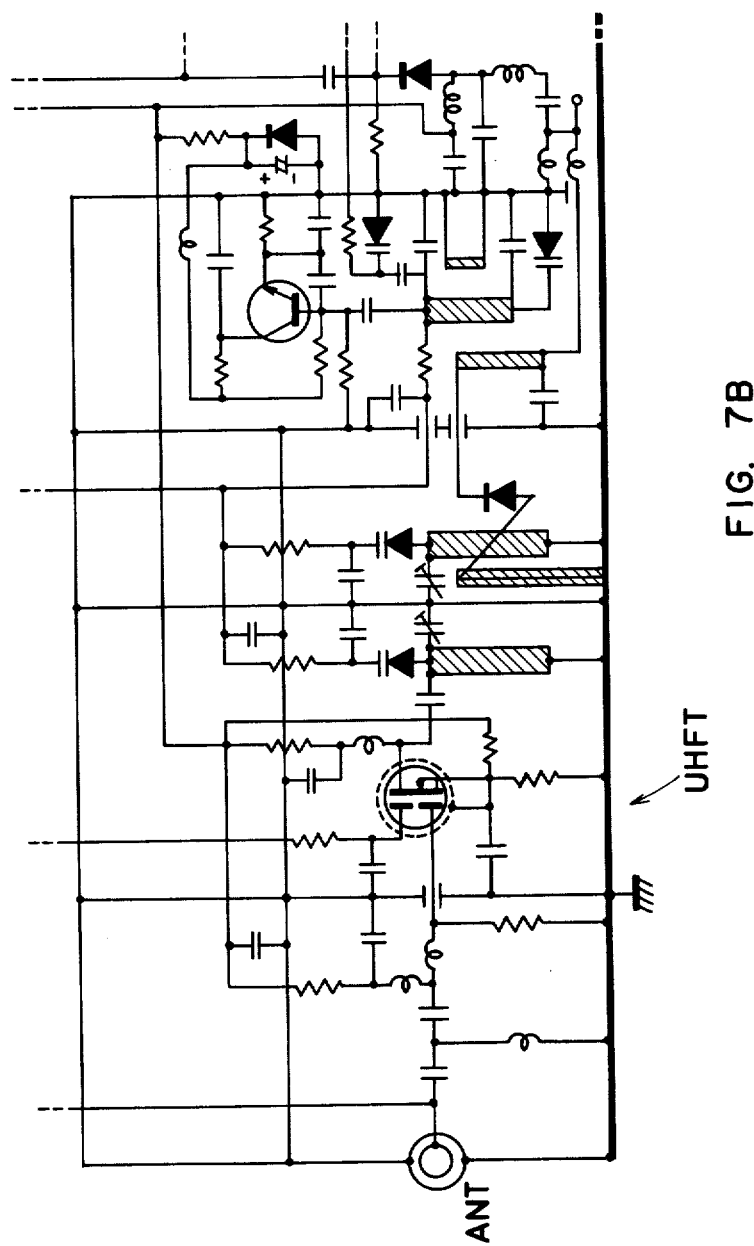
Figure 7C:
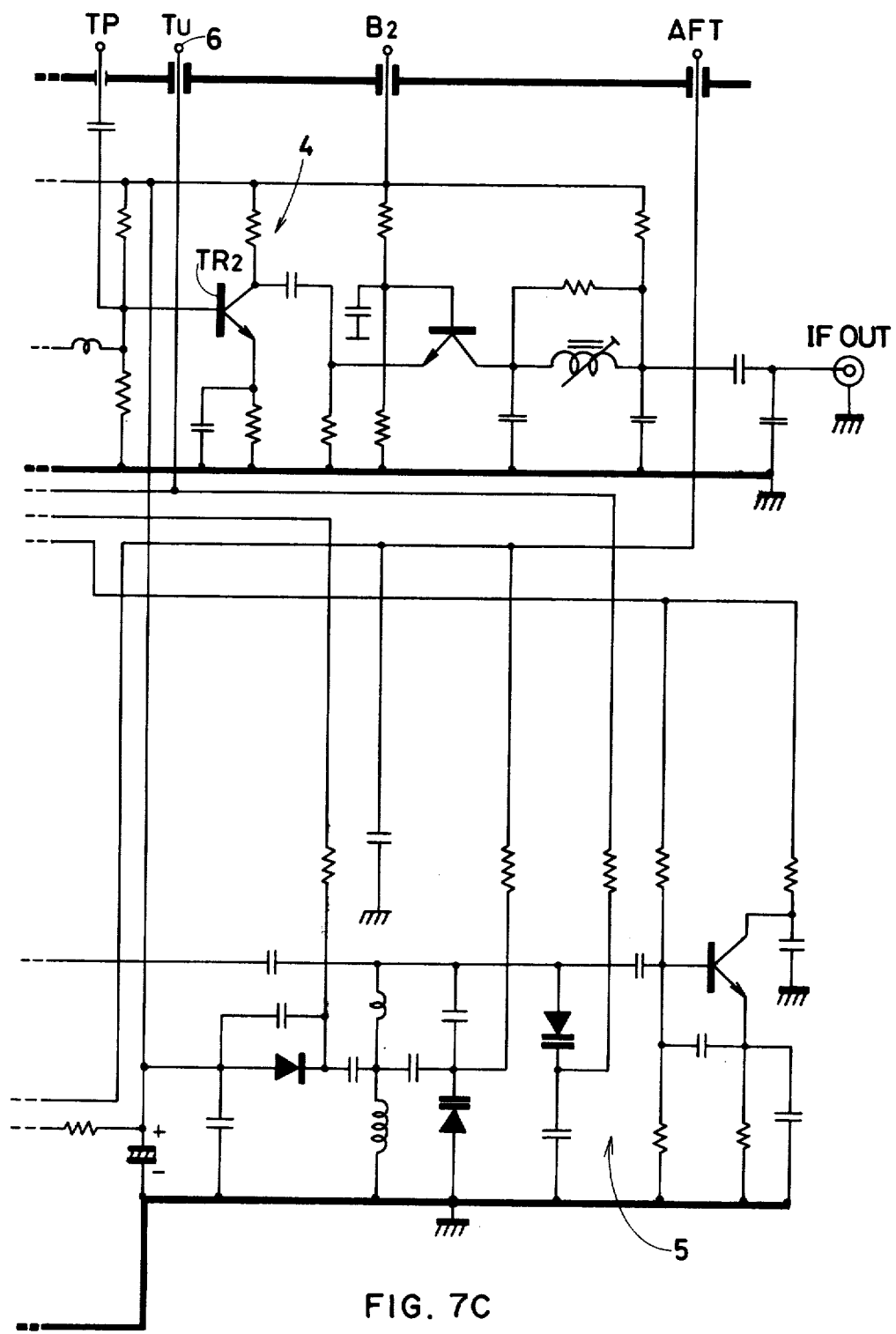

FIG. 7 is a schematic diagram of one example employing the FIG. 3 embodiment, with minor changes. The FIG. 7 embodiment comprises a combination of a VHF tuner VHFT and a UHF tuner UHFT which are adapted to be selectively operable, as well known to those skilled in the art. The VHF tuner VHFT comprises a high frequency tuning circuit 1, a high frequency amplifying transistor circuit 2, an interstage tuned coupling circuit 3, a mixer 4 and a local oscillator 5. The high frequency tuning circuit 1 is shown implemented by a connection of several coils and capacitors, to which a voltage controlled variable capacitance diode and a band selection switching diode are coupled. Since the high frequency tuning circuit 1 itself does not constitute an essential feature of the present invention and the same is well known to those skilled in the art, more detailed description is omitted. The high frequency amplifying transistor circuit 2 is shown comprising a field effect transistor TR1. The circuit configuration of the interstage tuned coupling circuit 3 is substantially the same as that of the FIG. 3 embodiment, except for several minor changes to be described subsequently, and therefore, the corresponding circuit components have been denoted by the same reference characters. In comparison of the interstage tuned coupling circuit 3 of the FIG. 7 embodiment with the FIG. 3 embodiment, the band selection switching diode D2 has been interposed in a reversed polarity, and the coil LB is connected to another coil of a small inductance value, which is interposed for another purpose not related with the present invention and the junction of these coils is coupled through a bypass capacitor to the anode of the band selection switching diode D2. Because of the above described changes, in case of low band reception mode by the FIG. 7 embodiment, the junction of the capacitor C5 and the base electrode of the transistor TR2 proves to be connected to the ground only through the capacitor C7. The mixer 4 is shown implemented by a transistor TR2. The local oscillator 5 basically comprises a combination of a transistor and a tuning circuit including coils and capacitors. The tuning circuit additionally comprises a voltage controlled variable capacitance diode for the tuning purpose, another voltage controlled variable capacitance diode for the automatic fine tuning purpose, and a band selection switching diode. Since the internal structure of the local oscillator 5 itself does not constitute an essential feature of the present invention and is well known to those skilled in the art, more detailed description thereof will be omitted. The UHF tuner UHFT is also shown in detail for the purpose of disclosing one example of such tuner. However, since the internal structure of the UHF tuner UHFT itself is neither an essential feature of the present invention and is well known to those skilled in the art, a more detailed description will be omitted.

The high frequency amplifying transistor circuit 2 and the local oscillator 5 are connected to be energized by a voltage source B1, which is adapted to be selectively enabled only in the VHF selection mode. The UHF tuner UHFT is connected to be energized by a voltage source UB which is adapted to be selectively enabled only in the UHF reception mode. On the other hand, the mixer 4 is connected to be energized by a voltage source B2 which is adapted to be selectively enabled in both the VHF and UHF reception modes. The high frequency amplifying transistor circuit 2 is also connected to receive an automatic gain control signal through a terminal AGC, which is obtained from a detector, not shown, as well known to those skilled in the art. The local oscillator 5 is connected to receive an automatic fine tuning control signal through a terminal AFT, which is obtained from a frequency detector, not shown, as well known to those skilled in the art. The tuning control voltage signal TU is applied through the terminal 6 to the above described voltage controlled variable capacitance diodes included in the high frequency tuning circuit 1, the interstage tuned coupling circuit 3 and the local oscillator 5. The band selection switching control signal SW is applied through the terminal 7 to the above described band selection switching diodes included in the high frequency tuning circuit 1, the interstage tuned coupling circuit 3 and the local oscillator 5. The junction between the capacitors C5 and C7 and the base electrode of the transistor TR2 is coupled outward through a test point terminal TP for the monitoring purpose. The above described terminals AGC, B1, SW, UB, TU, B2 and AFT are coupled outward through the respective feed-through capacitors formed through a casing of the tuner, not shown. The terminals B1, B2, UB, SW and TU are coupled to the respective contacts of a switching mechanism, not shown, for the above described selective operation, as well known to those skilled in the art.

In operation, in case of the VHF reception mode, the high frequency amplifying transistor circuit 2, the mixer 4 and the local oscillator 5 are energized while the UHF tuner UHFT is not energized, so that the VHF tuner VHFT including the high frequency tuning circuit 1, the high frequency amplifying transistor circuit 2, the interstage tuned coupling circuit 3, the mixer 4 and the local oscillator 5 is selectively enabled, and in case of the UHF reception mode, only the UHF tuner UHFT and the mixer 4 are energized while the remaining portions are not energized, so that the UHF tuner UHFT is selectively enabled. In the latter mentioned UHF reception mode, the output of the UHF tuner UHFT is applied through the junction between the capacitors C5 and C7 and the base electrode of the transistor TR2 to the mixer 4, in which case the mixer 4 serves as an amplifier for amplifying the output of the UHF tuner UHFT. It is pointed out that the UHF tuner UHFT is structured such that the frequency of the output of the UHF tuner UHFT is the same as the intermediate frequency of the VHF tuner VHFT.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A very high frequency tuner for selection of a broadcasting signal through variation of a reactance value formed across a voltage controlled variable reactance device responsive to a tuning control signal, comprising high frequency amplifier means, tuned coupling means coupled to said high frequency amplifier means for selectively withdrawing a tuned high frequency signal, local oscillator means for providing an oscillation frequency signal the frequency of which is different by a given frequency difference from said selectively withdrawn tuned high frequency signal, mixer means responsive to said tuned high frequency signal from said tuned coupling means and said local oscillation frequency from said local oscillator means for providing an intermediate frequency signal, said tuned coupling means comprising a first inductance coil coupled in series between said high frequency amplifier means and said mixer means, a voltage controlled variable reactance device coupled to the input of said first inductance coil in a shunt fashion so as to be responsive to a tuning control voltage, whereby a reactance value formed thereacross is variable as a function of the tuning control voltage, a second inductance coil coupled to the output of said first inductance coil in a shunt fashion, a first capacitor coupled to the output of said first inductance coil in a shunt fashion, switching means responsive to a band selection switching control signal for achieving a parallel tuning circuit including said voltage controlled variable reactance device and said first and second inductance coils in the low frequency band mode and for achieving a $\pi$-type tuning circuit including said voltage controlled variable reactance device, said first inductance coil and said first capacitor in the high frequency band mode, and coupling means for coupling the output of said tuned coupling means to said mixer means, said very high frequency tuner further comprising means for providing a tuning control voltage to said voltage controlled variable reactance device, and means for providing a band selection switching control signal representing selection of high or low frequency band.

2. A very high frequency tuner in accordance with claim 1, wherein said switching means comprises a switching device coupled between said second inductance coil and said first capacitor controllable to be rendered conductive in the high frequency band mode and to be rendered non-conductive in the low frequency band mode, and said coupling means comprises a second capacitor coupled between the junction of said switching device and said first inductance coil and the input of said mixer means and a third capacitor coupled between the junction of said switching device and said first capacitor and the input of said mixer means, whereby only said second capacitor is rendered effective in the low frequency band mode and both said second and third capacitors are rendered effective in the high frequency band mode.

3. A very high frequency tuner in accordance with claim 1, wherein said voltage controlled variable reactance device comprises a voltage controlled variable capacitance diode, a capacitance value of which is variable as a function of the tuning control voltage.

4. A very high frequency tuner in accordance with claim 1, wherein said switching means comprises a switching diode, and said band selection switching control signal providing means comprises means for providing a voltage adapted for selectively rendering said switching diode conductive or non-conductive.

* * * * *